United States Patent
Shim et al.

[19]

[11] Patent Number: 6,051,968
[45] Date of Patent: Apr. 18, 2000

[54] TEST BOARD PROVIDED WITH A CAPACITOR CHARGING CIRCUIT AND RELATED TEST METHOD

[75] Inventors: Weon Seob Shim, Chungcheongnam-do; Weon Sik Park, Seoul; Chan Ho Choi; Yong Su Kwon, both of Chungcheongnam-do, all of Rep. of Korea

[73] Assignee: Samsung Electroincs Co., Ltd., Suwon, Rep. of Korea

[21] Appl. No.: 08/905,019

[22] Filed: Aug. 1, 1997

[30] Foreign Application Priority Data

Aug. 3, 1996 [KR] Rep. of Korea ............. 96-32508
Jul. 8, 1997 [KR] Rep. of Korea ............. 97-31457

[51] Int. Cl.[7] ............................. G01R 1/04; G01R 31/02
[52] U.S. Cl. ..................... 324/158.1; 324/754; 324/755
[58] Field of Search ............................. 324/158.1, 754, 324/537, 755, 678, 658

[56] References Cited

U.S. PATENT DOCUMENTS 3,855,527 12/1974 Masopust, Jr. ................ 324/678
4,677,375 6/1987 Nakaie et al. ................ 324/757
4,743,837 5/1988 Herzog ......................... 324/678
4,812,755 3/1989 Toshiyuki et al. ............. 324/537
5,146,174 9/1992 Toliver et al. ................ 324/727
5,523,699 6/1996 Miyagawa ..................... 324/765

FOREIGN PATENT DOCUMENTS 61195362 8/1986 Japan.
63313079 12/1988 Japan.

*Primary Examiner*—Diep N. Do
*Assistant Examiner*—Jermele M. Hollington
*Attorney, Agent, or Firm*—Jones Volentine, L.L.P.

[57] ABSTRACT

A test board is provided to reduce the test time for integrated circuits required by the necessity to stabilize bias voltages applied to IC devices. The test board includes a capacitor connected to specific input terminals of the IC device and a capacitor charging circuit connected between the input terminals of the IC device and the capacitor charging circuit via switches. A testing method using this circuit includes the steps of mounting a test board to a tester, placing the IC device onto the test board, charging the capacitor by driving the capacitor charging circuit, and testing the IC devices according to test items. The test board used in this method includes application circuits for applying bias voltages to the IC device, a capacitor connected between the IC device and a ground terminal, and a capacitor charging circuit for charging the capacitor.

21 Claims, 2 Drawing Sheets

TEST BOARD PROVIDED WITH A CAPACITOR CHARGING CIRCUIT AND RELATED TEST METHOD

BACKGROUND OF THE INVENTION

The present invention generally relates to the testing of semiconductor integrated circuit (IC) devices. More particularly the present invention relates to a test board provided with a capacitor charging circuit for reducing the test time of the IC devices and a related test method.

In general, IC devices are manufactured through circuit design, wafer fabrication, and assembly processes. All of the devices produced through these manufacturing techniques must be tested before shipment to verify that the devices exhibit the intended normal functions specified during the initial circuit design step and to ensure that they have acceptable reliability and quality demanded by specific customers. Therefore, to manufactures who are producing IC devices in commercial quantity, the time required to test IC devices is an important factor in improving the productivity of such IC devices.

However, unlike digital IC devices, liner IC devices are tested in a condition where passive elements such as resistors and capacitors are connected to device pins and bias voltages supplied to the devices are stabilized. Unfortunately, some linear devices such as high power amplifiers and equalizer amplifiers require several milliseconds to stabilize the bias voltages, which results in an increase of overall test time.

FIG. 1 shows a circuit for a conventional test process for linear IC devices. In this conventional test process, a linear device 10 employs operational amplifiers as its main components. The linear device 10 has a positive power terminal 1, a positive input terminal 2, a negative input terminal 3, a negative power terminal 4, and an output terminal 5.

A positive supply voltage $V_{cc}$ (5V, for example) is supplied to the positive power terminal 1. A negative supply voltage (ground voltage, for example) is supplied to the negative power terminal 4. Input signals $V_i$ are supplied to the positive input terminal 2 as test signals by a tester (not shown). These input signals $V_i$ are supplied to the positive input terminal 2 through conductive pattern wirings formed on a test board (not shown). The negative input terminal 3 is connected to the ground terminal through a capacitor $C_i$. Output signals $V_o$ coming out through the output terminal 5 are delivered to the tester through the conductive pattern wires and are measured by the tester. The tester analyzes the output signals, and from this analysis determines the electrical characteristics of the device.

When measuring currents of the device 10, the capacitor $C_i$ must be charged. The charged voltage of the capacitor $C_i$ is then applied to the negative input terminal 3, and the current is measured by supplying the input signals $V_i$ to the device 10. The time required to charge the capacitor $C_i$ is determined by the equations:

$$Q=CV \tag{1}$$

$$Q=IT \tag{2}$$

$$T=CV/I \tag{3}$$

where Q is the electrical charge stored in the capacitor $C_i$, C is the dielectric constant of the capacitor $C_i$, V is the voltage applied across the capacitor $C_i$, I is the current flowing through the capacitor $C_i$, and T is the charging time of the capacitor $C_i$.

If the linear devices to be tested are high power devices such as power amplifiers and equalizer amplifiers, the current to be measured is often as great as 0.5 A or 1 A, and so the dielectric constant C of the capacitor $C_i$ is also great. As seen from the equation (3), the charging time T is proportional to the dielectric constant C, so as the dielectric constant increases, so to does the capacitor's charging time, which leads to an increase in the test time of each device.

SUMMARY OF THE INVENTION

It is an object of the present invention to reduce the test time by making bias voltages applied to IC devices to be quickly stabilized.

It is another object of the present invention to provide a test board provided with a capacitor charging circuit for reducing the test time and a test method using such a test board. A test board of the present invention comprises a capacitor connected to specific input terminals of the IC device, and a capacitor charging circuit connected between the input terminals of the IC device and the capacitor charging circuit via switches.

A test method of the present invention comprises the steps of: mounting a test board to a tester, the test board comprising application circuits for applying bias voltages to the IC device, a capacitor connected between the IC device and a ground terminal, a capacitor charging circuit for charging the capacitor; placing the IC device onto the test board; charging the capacitor by driving the capacitor charging circuit; and testing the IC devices according to test items.

BRIEF DESCRIPTION OF THE DRAWINGS

The above objects and advantages of the present invention are described further below, with reference to the accompanying drawings, in which.

DETAILED DESCRIPTION OF THE PREFERRED EMBODIMENT

Figure 1:
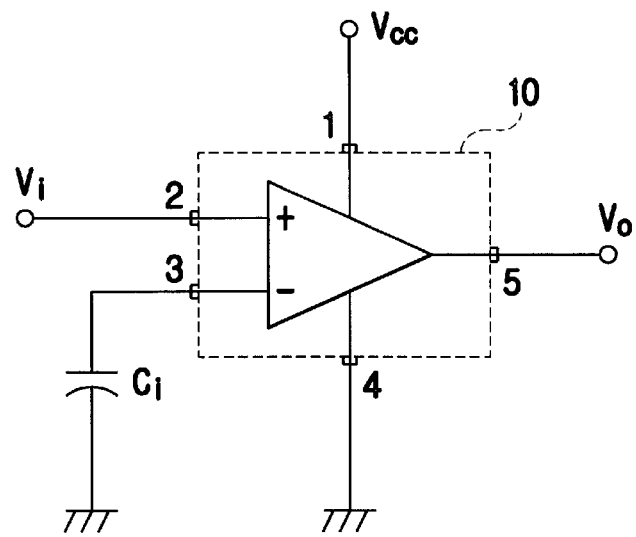
FIG. 1 shows a circuit used for a conventional test process for linear IC devices.
Figure 2:
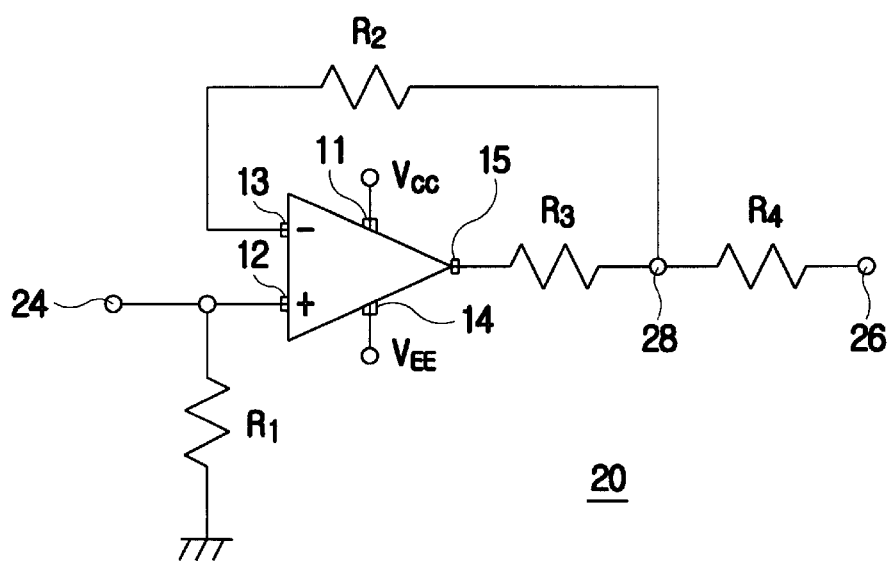
FIG. 2 is a circuit diagram of a capacitor charging circuit according to a preferred embodiment of the present invention.

FIG. 2 is a circuit diagram of a capacitor charging circuit 20 according to a preferred embodiment of the present invention. The capacitor charging circuit 20 uses an impedance conversion function (or buffering function) of an operational amplifier 22. The operational amplifier 22 has a positive power terminal 11, a positive input terminal 12, a negative input terminal 13, a negative power terminal 14, and an amplifier output terminal 15. In operation, the capacitor charging circuit 20 drives current through the charging circuit output terminal 26.

In this circuit, a positive supply voltage $V_{cc}$ is connected to the positive power terminal 11 and a negative supply voltage $V_{EE}$ is supplied to the negative power terminal 14. The positive input terminal 12 is connected to an input node 24. A first resistor $R_1$ is connected between the input node 24 and the ground terminal. A second resistor $R_2$ is connected between the input terminal 13 and an intermediate node 28. A third resistor $R_3$ is connected between the amplifier output terminal 15 and the intermediate node 28. Thus, the negative input terminal 13 is connected to the output of the operational amplifier via resistors $R_2$ and $R_3$ connected in series. A fourth resistor $R_4$ is connected between the intermediate node 28 and the output node 26. Thus, the amplifier output terminal 15 is connected to the charging circuit output terminal 26 via resistors $R_3$ and $R_4$ connected in series. Preferably, the resistors $R_2$ and $R_4$ have the same resistance value.

Figure 3:
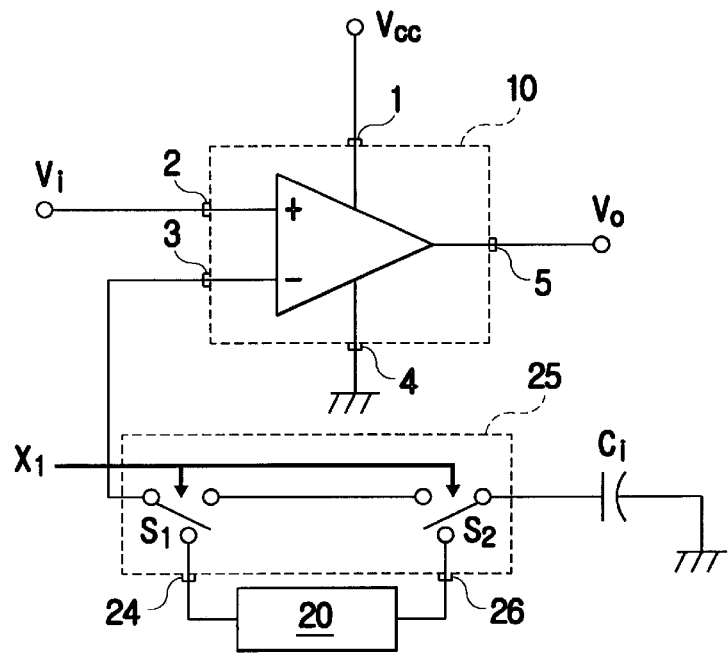
FIG. 3 is a schematic circuit diagram for showing the setup for a test process according to a preferred embodiment of the present invention.

FIG. 3 is a schematic diagram showing a circuit used for a test process of the present invention using the capacitor charging circuit 20 of FIG. 2. The device 10 to be tested has its positive input terminal 2 connected to the input signal $V_i$ supplied by a tester. The device 10 then supplies the output signal $V_o$ to the output terminal 5. The positive supply voltage ($V_{cc}$) is supplied to the positive power terminal 1 of the device 10, and the negative supply voltage (preferably ground voltage) is supplied to the negative power terminal 4 of the device 10. The negative input terminal 3 of the device 10 is connected to the ground terminal through the capacitor $C_i$. A capacitor charging circuit 20 according to a preferred embodiment of the present invention is connected between the negative input terminal 3 and the capacitor $C_i$ through switches $S_1$ and $S_2$, collectively referred to as the plurality of switches 25.

The switches $S_1$ and $S_2$ are controlled by the tester using a control signal $X_1$ to be concurrently opened and closed. When the switches $S_1$ and $S_2$ are closed, the input terminal 24 and the charging circuit output terminal 26 of the capacitor charging circuit 20 are connected to the negative input terminal 3 of the device 10 and the capacitor $C_i$, respectively. The closing of the switches $S_1$ and $S_2$ are maintained for several milliseconds, which allows the capacitor $C_i$ to be electrically charged by a current driven through the charging circuit output terminal 26 of the capacitor charging circuit. Then, when the switches $S_1$ and $S_2$ are opened, a voltage produced by the electrical charges is applied to the negative input terminal 3 of the device 10. With this, operational currents of the device 10 can be measured in shorter time, and then the overall test time can be reduced.

Figure 4:
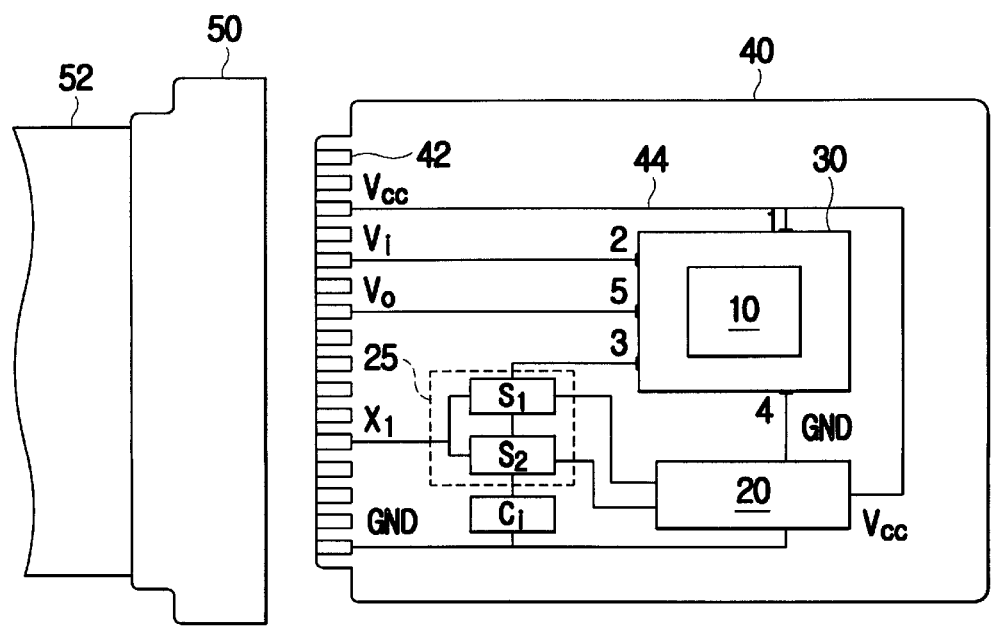
FIG. 4 is a schematic diagram showing a test board having a capacitor charging circuit and test process circuit according to a preferred embodiment of the present invention.

FIG. 4 shows a test board having the capacitor charging circuit 20 according to a preferred embodiment of the present invention. The high power linear IC device 10 to be tested is inserted into a socket 30 on the test board 40. Device terminals are electrically connected to corresponding socket pins. The socket pins are electrically connected to board terminals 42 via conductive pattern wirings 44. The board terminals 42 are coupled to a connector 50, and the connector 50 is coupled to a tester through a cable 52. As a result, test signals such as $V_{cc}$, $V_i$, and GND (ground voltage) are supplied to the device 10 from the tester, and the output signals $V_o$ from the device 10 can be delivered to the tester.

The capacitor charging circuit 20 and the switches $S_1$ and $S_2$ are formed on the test board. The switches $S_1$ and $S_2$ and the capacitor $C_i$ are connected between the negative input terminal 3 of the device 10 and the ground terminal GND. The switches $S_1$ and $S_2$ are controlled by the tester, which is operated according to a predetermined test program. For example, if a specific positive voltage is applied to the switches $S_1$ and $S_2$, the switches are closed and thus the capacitor charging circuit 20 is connected to the capacitor $C_i$. The test board is provided with application circuits for testing the device in real operating conditions, but the application circuits are omitted to simplify the drawing.

The test process of the present invention is carried out through the following steps using a test board containing the capacitor charging circuit. The test board 40 is mounted onto a handler of the tester, and is then electrically connected to the tester through the connector 50. The IC device 10 to be tested is prepared by inserting the device 10 to the socket 30 and confirming that the electrical connections are satisfactory.

A predetermined test program is then loaded to the tester. The tester then provides test signals to the device and measures output signals from the device according to test items defined by a test program. Before performing each test item, the tester controls the switches $S_1$ and $S_2$ to connect capacitor $C_i$ to the capacitor charging circuit 20, and then waits for a predetermined time for the capacitor to be fully charged. Next, the tester opens the switches $S_1$ and $S_2$, so that the charged capacitor $C_i$ is connected to the input terminal 3 of the device 10, and a stable DC bias can be supplied to the device to be tested.

The test items are generally divided into DC test items and AC test items. The DC test items include min/typical/max operating currents, DC voltages applied to each pins of the device, leakage currents, and open/short checking. The charging of the capacitor can be omitted before carrying out the leakage current test and open/short checking.

On the other hand, the AC test items are amplification gain, gain balance, output distortion, crosstalk, output power, and internal noise. Before beginning the AC test item, the capacitor should be charged by the capacitor charging circuit 20. Although the charging of the capacitor according to the present invention requires a certain wait time, this wait time is shorter than that needed to stabilize bias voltages through the use of device supply voltage, e.g., $V_{cc}$.

While this invention has been described with reference to illustrative embodiments, this description is not intended to be construed in a limiting sense. Various modifications and combinations of the illustrative embodiments, as well as other embodiments of this invention, will be apparent to persons skilled in the art upon reference to the description. It is therefore intended that the appended claims encompass any such modifications or embodiments.

What is claimed is:

1. A test board for testing an integrated circuit device by relaying electrical signals between the integrated circuit device and a tester, the test board comprising:

a socket for receiving the integrated circuit device, and having a socket input terminal;

a capacitor having first and second capacitor terminals, the first capacitor terminal being connected to a negative supply voltage;

a first switch having a first fixed terminal and first and second switching terminals, the first fixed terminal being connected to the socket input terminal;

a second switch having a second fixed terminal and third and fourth switching terminals, the second fixed terminal being connected to the second capacitor terminal, and the fourth switching terminal being connected to the second switching terminal of the first switch; and a capacitor charging circuit having a charging input terminal connected to the first switching terminal of the first switch and a charging output terminal connected to the third switching terminal of the second switch, wherein when in a first state, the first switch connects the first fixed terminal to the second switching terminal, and the second switch connects the second fixed terminal to fourth switching terminal, so that the first and second switches connect the capacitor to the socket input terminal, and when in a second state, the first switch connects the first fixed terminal to the first switching terminal, and the second switch connects the second fixed terminal to the third switching terminal, so that the first switch connects the charging input terminal to the socket input terminal and the second switch connects the charging output terminal to the capacitor.

2. A test board as recited in claim 1, wherein the socket input terminal is connected to a device input terminal of the integrated circuit device.

3. A test board as recited in claim 1, wherein the negative supply voltage is a ground voltage.

4. A test board as recited in claim 1, wherein the integrated circuit device is a high power linear integrated circuit device.

5. A test board as recited in claim 1, wherein the test board further comprises:
   board terminals electrically connected to the tester through a cable; and
   a plurality of conductive pattern wirings for electrically connecting the socket and the board terminals.

6. A test board as recited in claim 1, wherein the states of the first and second switches are controlled by a control signal supplied by the tester.

7. A test board as recited in claim 1, wherein the switches are relay switches.

8. A test board as recited in claim 1, wherein the capacitor charging circuit comprises:
   an operational amplifier having a positive input terminal, a negative input terminal, and an output terminal;
   a first resistor connected between a ground terminal and the positive input terminal, the positive input terminal serving as the charging input terminal;
   a second resistor connected between the output terminal and an intermediate node;
   a third resistor connected between the negative input terminal and the intermediate node; and
   a fourth resistor connected between the intermediate node and the charging output terminal.

9. A test board as recited in claim 8, wherein the third and the fourth resistors have the same resistance values.

10. A test board, comprising:
    an integrated circuit device having a device input terminal;
    a capacitor having first and second capacitor terminals, the first capacitor terminal being connected to a negative supply voltage;
    a first switch having a first fixed terminal and first and second switching terminals, the first fixed terminal being connected to the device input terminal;
    a second switch having a second fixed terminal and third and fourth switching terminals, the second fixed terminal being connected to the second capacitor terminal, and the fourth switching terminal being connected to the second switching terminal of the first switch; and
    a capacitor charging circuit having a charging input terminal connected to the first switching terminal of the first switch and a charging output terminal connected to the third switching terminal of the second switch,
    wherein when in a first state, the first switch connects the first fixed terminal to the second switching terminal, and the second switch connects the second fixed terminal to the fourth switching terminal, so that the first and second switches connect the capacitor to the device input terminal, and when in a second state, the first switch connects the first fixed terminal to the first switching terminal, and the second switch connects the second fixed terminal to the third switching terminal, so that the first switch connects the charging input terminal to the device input terminal and the second switch connects the charging output terminal to the capacitor.

11. A test board as recited in claim 10, wherein the negative supply voltage is a ground voltage.

12. A test board as recited in claim 10, wherein the integrated circuit device is a high power linear integrated circuit device.

13. A test board as recited in claim 10, wherein the test board further comprises:
    a socket to which the integrated circuit device is inserted;
    board terminals electrically connected to the tester through a cable; and
    a plurality of conductive pattern wirings for electrically connecting the socket and the board terminals.

14. A test board as recited in claim 10, wherein the states of the first and second switches are controlled by a control signal supplied by the tester.

15. A test board as recited in claim 10, wherein the switches are relay switches.

16. A test board as recited in claim 10, wherein the capacitor charging circuit comprises:
    an operational amplifier having a positive input terminal, a negative input terminal, and an output terminal;
    a first resistor connected between a ground terminal and the positive input terminal, the positive input terminal serving as the charging input terminal;
    a second resistor connected between the output terminal and an intermediate node;
    a third resistor connected between the negative input terminal and the intermediate node; and
    a fourth resistor connected between the intermediate node and the charging output terminal.

17. A test board as recited in claim 16, wherein the third and the fourth resistors have the same resistance values.

18. A test board for testing an integrated circuit device by relaying electrical signals between the integrated circuit device and a tester, the test board comprising:
    a capacitor connected to a negative power supply voltage; and
    a plurality of switches connected in series between the capacitor and an input terminal of the integrated circuit device;
    a capacitor charging circuit connected to the plurality of switches,
    wherein when in a first state, the plurality of switches connect the capacitor to the input terminal of the integrated circuit device, and when in a second state, the plurality of switches connect the capacitor charging circuit in between the input terminal of the integrated circuit device and the capacitor.

19. A test method for testing integrated circuit devices, the method comprising the steps of:

mounting a test board to a tester;

placing the integrated circuit device onto the test board;

charging a capacitor connected to the integrated circuit device by driving a capacitor charging circuit; and testing the integrated circuit device.

20. The test method as recited in claim 19, wherein the integrated circuit device is a high power linear integrated circuit device.

21. The test method as recited in claim 19, wherein the step of testing the integrated circuit device is performed in response to at least one of the parameters chosen from the group consisting of operational current, pin voltage, amplification gain, gain balance, output distortion, crosstalk, output power, and internal noise.

* * * * *